(12) United States Patent
Negley

(10) Patent No.: US 7,303,632 B2
(45) Date of Patent: Dec. 4, 2007

(54) VAPOR ASSISTED GROWTH OF GALLIUM NITRIDE

(75) Inventor: Gerald H. Negley, Carrboro, NC (US)

(73) Assignee: Cree, Inc., Durham, NC (US)

( * ) Notice: Subject to any disclaimer, the term of this patent is extended or adjusted under 35 U.S.C. 154(b) by 249 days.

(21) Appl. No.: 10/853,920

(22) Filed: May 26, 2004

(65) Prior Publication Data

US 2005/0263065 A1 Dec. 1, 2005

(51) Int. Cl.
*C30B 29/38* (2006.01)

(52) U.S. Cl. .................. 117/101; 117/104; 117/105; 117/956

(58) Field of Classification Search .......... 117/101, 117/104, 105, 956
See application file for complete search history.

(56) References Cited

U.S. PATENT DOCUMENTS

| | | | |
|---|---|---|---|
| 3,617,381 A | | 11/1971 | Hanak |
| 3,655,438 A | * | 4/1972 | Sterling et al. ............. 427/579 |
| 4,477,688 A | | 10/1984 | Barnett et al. |
| 4,605,921 A | | 8/1986 | Riddle et al. |
| 4,612,411 A | | 9/1986 | Wieting et al. |
| 4,734,381 A | | 3/1988 | Mitchell |
| 4,798,660 A | | 1/1989 | Ermer et al. |
| 5,215,938 A | | 6/1993 | Arroyo |
| 5,301,499 A | | 4/1994 | Kure-Jensen et al. |
| 5,679,152 A | | 10/1997 | Tischler et al. |
| 6,270,569 B1 | | 8/2001 | Shibata et al. |
| 6,407,409 B2 | | 6/2002 | Cho et al. |
| 6,582,986 B2 | | 6/2003 | Kong et al. |
| 2001/0055660 A1 | | 12/2001 | Tischler et al. |
| 2002/0011599 A1 | * | 1/2002 | Motoki et al. ............. 257/76 |
| 2002/0028314 A1 | | 3/2002 | Tischler et al. |
| 2005/0217565 A1 | * | 10/2005 | Lahreche et al. ............. 117/84 |

OTHER PUBLICATIONS

Perrier et al.; Growth of semiconductors by the close-spaced vapor transport technique: A review; J. Mater Res. 3 (5), Sep./Oct. 1988, pp. 1031-1042.
Mauk et al.; Development of Low-Cost Substrates and Deposition Processes for High Performance GaAs-Based Thin Film Solar Cells; AstroPower, Inc., Solar Park, Newark, DE 19711; pp. 271-272.
Huang et al.; Defect reduction with quantum dots in GaN grown on sapphire substrates by molecular beam epitaxy; Appl. Phys. Lett., vol. 80, No. 2, Jan. 14, 2002, pp. 216-218.
Linthicum et al.; Process Routes for Low Defect-Density GaN on Various Substrates Employing Pendeo-Epitaxial Growth Techniques, MRS Internet J. Nitride Semicond. Res. 4S1, G4.9 (1999) [7 pages].
Gottlieb et al.; Epitaxial Growth of GaAs Using Water Vapor, RCA Review, Dec. 1963, pp. 585-595.
Robinson; Transport of Gallium Arsenide by a Close-Spaced Technique, RCA Review, Dec. 1963, pp. 574-584.

\* cited by examiner

*Primary Examiner*—Robert Kunemund
(74) *Attorney, Agent, or Firm*—Summa, Allan & Addition, P.A.

(57) ABSTRACT

A vapor transport growth process for bulk growth of high quality gallium nitride for semiconductor applications is disclosed. The method includes the steps of heating a gallium nitride source material, a substrate suitable for epitaxial growth of GaN thereon, ammonia, a transporting agent that will react with GaN to form gallium-containing compositions, and a carrier gas to a temperature sufficient for the transporting agent to form volatile Ga-containing compositions from the gallium nitride source material. The method is characterized by maintaining the temperature of the substrate sufficiently lower than the temperature of the source material to encourage the volatile gallium-containing compositions to preferentially form GaN on the substrate.

42 Claims, No Drawings

VAPOR ASSISTED GROWTH OF GALLIUM NITRIDE

BACKGROUND

The present invention relates to the growth of large single crystals of semiconductor materials for electronic applications and in particular relates to the bulk growth of gallium nitride single crystals for use as a substrate and related elements in semiconductor devices.

Gallium nitride (GaN) and its related Group III nitrides have gained significant interest and commercial acceptance as semiconductor materials in the last decade. As well understood in this art, the term Group III nitrides refers to binary, ternary and tertiary compounds formed by one or more of the elements from Group III of the periodic table, particularly gallium (Ga), aluminum (Al) and indium (In).

Gallium nitride is a wide bandgap (3.36 eV at 300 K) semiconductor which provides it with the capability of handling power applications at an order of magnitude or more better than semiconductors such as silicon (1.12 eV) or gallium arsenide (1.42 eV). The bandgap also provides light emitting diodes (LEDs) formed in gallium nitride and the other Group III nitrides with the capability of emitting photons that are in the green, blue, violet, and ultraviolet (i.e. higher energy) portions of the visible and near-ultraviolet spectrum. In turn, when blue LEDs are combined with red and other lower energy spectrum color LEDs or with appropriate phosphorus, they provide the opportunity to create white light.

Gallium nitride and the related Group III nitrides are also direct emitters; i.e. an electron hole recombination event creates energy entirely in the form of a photon and without the concurrent production of vibrational energy (e.g., a phonon). The loss of energy to a phonon in indirect (even if wide bandgap) semiconductors such as silicon carbide, reduces the light-generating efficiency of the emission. Stated differently, energy is always conserved in such transitions, but the emission of energy is entirely as light in a direct emitter while only partially as light in an indirect emitter. Thus, generally speaking and all other factors being equal, gallium nitride and the other Group III nitrides are more efficient in terms of producing visible light than is silicon carbide.

Gallium nitride has additional attributes that make it extremely desirable as a semi-conductor material. First, it has a high electron mobility and saturation velocity giving it the capability of amplifying high frequency signals. Second, gallium nitride can accommodate high voltages without breakdown, which is also important for rectifying and amplifying applications. Gallium nitride can also operate (in appropriate devices) at frequencies potentially as high as 40 gigahertz (GHz), and has a power density at least six (6) times as great as silicon. For these and other reasons, gallium nitride is also expected to be a significant foundation for the semiconductor devices required or desired for newer generations of wireless technologies.

The growth and incorporation of epitaxial layers of gallium nitride and related Group III nitrides has matured sufficiently for GaN to appear in many commercial devices, particularly light emitting diodes. Nevertheless, commercially viable, larger or "bulk" single crystals of gallium nitride remain an elusive target. As a result, most gallium nitride or Group III nitride-based devices are formed on sapphire ($Al_2O_3$) or silicon carbide (SiC) substrates. Sapphire transparency over a wide frequency range and its physical strength. It cannot be conductively doped, however, and thus adjustments must be made to the device designs to incorporate its insulating character. In particular, the insulating properties of sapphire require that two electrodes to be formed on a single side of a device, thus demanding valuable extra chip space and size.

Silicon carbide (SiC) offers further advantages over sapphire as a substrate material for GaN and other Group III nitrides. SiC can be conductively doped and has a better lattice match (a lattice constant of 3.086 Å) with GaN (3.189 Å) than does sapphire (4.913 Å). A slight lattice mismatch still remains, however, between silicon carbide and gallium nitride. Such mismatches generate defects (dislocations) during growth, during temperature cycling (because of differences in thermal expansion) and during use. Such defects are already recognized as reducing the life of nitride-based lasers and light-emitting diodes, and have even more serious ramifications for high power devices that must be able to withstand much higher biases.

From the standpoint of eliminating crystal mismatch problems from devices, the best solution in almost all circumstances is to have a substrate with an identical or extremely close chemical and physical (particularly lattice) match to the materials used for the active portions of the device. Thus, the availability of silicon carbide substrates for silicon carbide based devices helped drive the rapid growth in silicon carbide technology that began in the late 1980's. Accordingly, in order to provide the theoretically best substrates for gallium nitride and Group III nitride based devices, a logical goal is to provide gallium nitride substrates for such devices so that they can be identically lattice matched with their active portions. For a number of reasons, however, gallium nitride has been difficult to form into bulk single crystals with a low enough defect density to provide worthwhile substrates for electronic devices. There are a number of difficulties in attempting to grow gallium nitride in bulk crystal, rather than epitaxial, fashion.

Gallium nitride does not grow easily from a melt because of its relatively high decomposition rate. In response, techniques have included attempts at ultra-high pressure solutions and sublimation, but these have tended to suffer from significant growth rate problems or high complexity. Other more successful techniques such as pendeo and lateral overgrowth techniques (e.g., U.S. published Application 20020022290) have improved the quality of available gallium nitride, but may proceed at relatively low growth rates. Stated differently, because devices formed in epitaxial layers are relatively small, the relatively slow growth rates (of admitted higher quality) of epitaxial layers are acceptable. Nevertheless, slower growth rates are less acceptable for commercial production of semiconductor substrates, which need to have a thickness on the order of 30 mils (about 0.76 millimeters) and diameters of at least two inches, with even larger diameters being preferred.

Processes such as vapor phase epitaxy ("VPE") and chemical vapor deposition ("CVD") can also drive up manufacturing costs because of their frequent use of halogen (particularly chlorine) compounds. The use of halogens greatly increases the necessity for chemically resistant materials in growth chambers and systems, and both molecular chlorine ($Cl_2$) and chloride ion ($Cl^{-1}$) can generate a number of undesired and disadvantageous side reactions. Vapor phase epitaxy is also very slow with nominal rates of between about one and two microns per hour, and "aggressive" growth rates being only between about five and ten microns per hour. Such rate tend to be commercially unacceptable for growing gallium nitride crystals in the bulk sizes (thickness and diameter) useful for device substrates.

The crystal melt techniques require both pressures approaching 100 atmospheres and the use of liquid gallium because nitrogen will not dissolve in gallium at atmospheric pressure. By way of comparison gallium arsenide (GaAs) can be produced at pressures of about five (5) atmospheres and gallium phosphide (GaP) can be produced at pressures of about 35 atmospheres.

Sublimation techniques also seem to fail to date in gallium nitride, with growth rates appearing to simply stop after the process has proceeded for a reasonable period of time.

More recent techniques include those in which GaN is first grown on a non-GaN substrate and then removed in bulk fashion; e.g. U.S. Pat. No. 5,679,152 or 6,407,409. Such techniques can be considered variations of epitaxial growth rather than bulk substrate growth.

Accordingly, the need continues to exist for techniques for producing high quality single crystal gallium nitride in amounts and at rates and at crystal sizes, that are suitable for substrate applications in semiconductor devices.

SUMMARY

The invention is a growth process for producing bulk single crystalline gallium nitride with low defect density for semiconductor applications. The method comprises introducing a gallium nitride source material and a seed crystal into a vapor transport crystal growth chamber, introducing an oxygen-containing gas, a hydrogen-containing gas, and a nitrogen containing gas into the vapor transport crystal growth chamber to encourage the source material to form volatile compounds containing gallium, oxygen and nitrogen, heating the source material to a temperature sufficient to encourage the volatile compositions to produce growth of gallium nitride on the seed crystal at a rate of at least about 10 microns per minute ($\mu$/min), and while heating the seed crystal to, and maintaining the seed crystal at, a temperature approaching, but less than the temperature of the source material to thereby preferentially encourage gallium nitride growth on the seed crystal.

In another aspect, the invention is a gallium nitride single crystal having a diameter of at least two inches, a thickness of 30 mils and a defect density of less than $10^8$ per square centimeter ($cm^{-2}$).

In yet another aspect, the invention is a vapor transport growth process for bulk growth of high quality gallium nitride for semiconductor applications. In this aspect the invention comprises heating a gallium nitride source material, a substrate suitable for epitaxial growth of GaN thereon, ammonia, a transporting agent that will react with GaN to form gallium-containing compositions, and a carrier gas to a temperature sufficient for the transporting agent to form volatile Ga-containing compositions from the gallium nitride source material. The method is further characterized by maintaining the temperature of the substrate sufficiently lower than the temperature of the source material to encourage the volatile gallium-containing compositions to preferentially form GaN on the substrate.

The foregoing and other objects and advantages of the invention and the manner in which the same are accomplished will become clearer based on the followed detailed description.

DETAILED DESCRIPTION

The invention is a growth process for producing high quality bulk single crystal gallium nitride with low defect density for semiconductor applications. In this aspect, the method comprises introducing a gallium nitride source material and a seed crystal into a vapor transport crystal growth chamber, and introducing an oxygen containing gas, a hydrogen containing gas, and a nitrogen containing gas into the vapor transport crystal growth chamber to encourage the source material to form volatile compositions containing gallium, oxygen and nitrogen (but not necessarily all three elements in each compound). The method next comprises heating the source material to a temperature sufficient to encourage the volatile compositions to produce growth of gallium nitride on the seed crystal at a rate of at least about ten microns per minute. As a part of the process, the seed crystal is heated to, and maintained at, a temperature approaching, but less than the temperature of the source material so that the volatile compositions are preferentially encouraged to produce gallium nitride growth on the seed crystal.

The added gases containing oxygen, hydrogen and nitrogen can be selected as appropriate, provided that they carry out the desired transport function and do not otherwise adversely affect the desired reactions or the gallium nitride source material or the seed crystal or the gallium nitride that grows upon the seed crystal. In preferred embodiments, the oxygen containing gas is selected from the group consisting of water vapor, carbon monoxide, and mixtures thereof, with water vapor being most preferred. Molecular hydrogen is the preferred hydrogen containing gas and ammonia is the preferred nitrogen containing gas. The additional nitrogen provides an over pressure of nitrogen in the chamber, given that nitrogen is also present in the gallium nitride source material and the growing bulk crystal. Thus, in one sense, the method can be viewed as incorporating a greater than stoichiometric amount of nitrogen during the growth process.

In a preferred embodiment, the method includes the preliminary steps of heating the seed crystal to a temperature is higher than the temperature of the source material to initially prevent premature growth of any type on the seed crystal prior to the steps of introducing the water vapor, hydrogen and ammonia into the growth chamber. Once the water vapor, hydrogen and ammonia are introduced into the growth chamber, the temperature relationship is inverted so that the temperature of the seed crystal is maintained (as noted above) lower than the source material to preferentially encourage the gallium nitride growth on the seed crystal.

Once the volatile compositions react to form GaN on the seed, the original gases can be regenerated.

The seed crystal can be any material appropriate for initiating the growth of bulk gallium nitride thereon, but is most preferably a gallium nitride seed crystal. The source material can include gallium nitride powder, single crystal gallium nitride, or polycrystalline gallium nitride, all in various physical forms (e.g. a plurality of smaller, higher-defect crystals, etc.). As recognized by those familiar with various chemical and physical processes, the preferential growth on the seed crystal, if carried out appropriately, will provide a greater degree of purity and crystal structure than may be present in the starting material.

In preferred embodiments, the process gases are added at the rate of between about 0.1 and 0.5 liters per minute in a blend of about 5 percent hydrogen and 95 percent ammonia. Water vapor should be added at an appropriate partial pressure. As is well understood with respect to the gas laws (particularly Dalton's Law), the relative amount of each gas present is directly proportional to its partial pressure contribution to the total pressure.

An excess of water vapor may tend to trap oxygen into the seed crystal, form deep levels and potentially render the growing GaN semi-insulating. Although semi-insulating material is useful in some circumstances, it is generally preferable to obtain it on as as-desired basis rather than through lack of process control. Thus the amount of water vapor should be maintained at an amount that avoids this problem. From the opposite standpoint, too little water vapor tends to decompose the source but fails to transport the gallium to the seed crystal.

There is little or no disadvantage to an excess of ammonia in the system, and similarly little or no disadvantage to an excess of hydrogen in the system.

With respect to temperature, an excessively high temperature will tend to encourage competing, undesired reactions. A temperature that is too low will either fail to carry forward any of the desired reactions or will carry them forward at such a low rate as to be disadvantageous. An excessively high temperature likewise can cause the hydrogen to become chemically aggressive with respect to the source material and drive undesired impeding reactions.

In preferred embodiments, the source material is maintained at a temperature of between about 800° and 900° centigrade (C.) during crystal growth, with the seed crystal being maintained at a temperature that is between about 50° and 100° C. below the temperature of the source material during crystal growth.

In a preferred embodiment, the ambient pressure within the vapor transport crystal growth chamber is maintained below atmospheric pressure, and more preferably is maintained at about 100 torr. The reduction in pressure provides a proportional increase in the mean free path of the gas molecules. In turn, the increased mean free path reduces unwanted side reactions. This effect can also be enhanced by increasing the spacing between the source material and the seed crystal. Thus, although certain vapor transport mechanisms and processes such as close-spaced vapor transport (CSVT) are based upon small spacing (e.g. 1-3 millimeters in order to preclude the surroundings from affecting the reaction) the present invention can be carried out using lower pressure and increased source seed spacing. In preferred embodiments the method comprises maintaining a distance of between about 10 and 30 millimeters between the source material and the seed crystal in the growth chamber. If desired, however, closer spacing (including spacing typical of CSVT) can be incorporated.

In preferred embodiments, the oxygen containing gas that is introduced is selected on the basis that it will react to form a composition selected from the group consisting of $Ga_2O_3$, $GaO$, and $Ga_2O$ and mixtures thereof in the growth chamber during the growth process. Similarly, the hydrogen containing gas will preferably react with nitrogen in the source materials to thereby minimize or eliminate atomic nitrogen in the growth chamber during the growth process.

From a reaction scheme standpoint, the preferred reactions are as follows. The reactions are shown as starting with GaN to produce the volatile species, but all are reversible at the seed to generate GaN and regenerate the original transport gases.

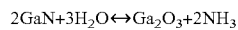
$2GaN + 3H_2O \leftrightarrow Ga_2O_3 + 2NH_3$

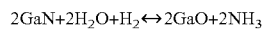
$2GaN + 2H_2O + H_2 \leftrightarrow 2GaO + 2NH_3$

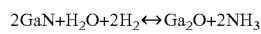
$2GaN + H_2O + 2H_2 \leftrightarrow Ga_2O + 2NH_3$

The resulting gallium nitride single crystal exhibits superior properties and can have a diameter of at least about two inches, a thickness of at least about 30 mils and a defect density of less than $10^8$ per square centimeter ($cm^{-2}$), with defect densities of less than $10^7$ or even $10^5$ $cm^{-3}$ preferred.

The use of growth chambers, heating, and supplying materials to crystal growth environments is generally well understood in this art and can be practiced by those of ordinary skill and without undue experimentation. The present invention can be carried out in a manner similar (and if desired, identical) to close space vapor transport (CSVT) which is also well-understood in this art; e.g. U.S. Pat. Nos. 5,215,938; 4,734,381; 4,605,921; 4,477,688; 3,617,381; 5,301,499; 4,798,660; and 4,612,411 all refer to this technique for semiconductor growth. See also Perrier, *Growth of Semiconductors by the Close-Space Vapor Transport Technique: A Review*, J. Mater. Res. 3(5), September/October 1988 at pages 1031-42. In most CSVT techniques, the spacing between the source and substrate is maintained at less than one-tenth of the source and substrate dimensions, the goal of which is to make transport within such space largely independent of the conditions elsewhere in the system.

As noted elsewhere herein, however, the present invention is not constrained by the one-tenth relationship and in the invention the source and substrate spacing can be an order or magnitude greater than in CSVT.

Described in general (yet appropriate) terms, the growth chamber should be capable of supporting the flow of the necessary gases and intermediate compounds at atmospheric pressure and below, and of supporting the necessary temperature gradients. Although such growth chambers are often custom made, such customization is typical of crystal growth systems, incorporates well-known and commercially available components, and can be carried out by those of ordinary skill in this art without undue experimentation.

Thus, the invention can also be described as a vapor transport growth process for bulk growth of high quality gallium nitride for semiconductor applications. Expressed in this manner, the method comprises the steps of heating a gallium nitride source material, a substrate suitable for epitaxial growth of gallium nitride thereon, ammonia, a transporting agent that will react with gallium nitride to form gallium-containing compositions, and a carrier gas, all to a temperature sufficient for the transporting agent to form volatile gallium-containing compositions from the gallium nitride source material. The method is characterized by maintaining the temperature of the substrate sufficiently lower than the temperature of the source material to encourage the volatile gallium-containing compositions to preferentially form gallium nitride on the substrate. Additionally, the original transporting agent is typically regenerated after the gallium nitride grows on the substrate.

In preferred embodiments, the gallium nitride source material is a gallium nitride source powder, single-crystal gallium nitride, or polycrystalline gallium nitride. Similarly, the substrate can comprise any material that will appropriately support the epitaxial growth of gallium nitride including sapphire and silicon carbide, but most preferably comprises a gallium nitride seed crystal.

The transporting agent preferably will react with gallium nitride to form compositions that contain gallium and oxygen and in the most preferred embodiments, the transporting agent is selected from the group consisting of water vapor and carbon monoxide, with water vapor being most preferred.

As in the other embodiments, the preferred carrier gas is hydrogen, and the method comprises heating the source material to a temperature of between about 800° and 900°

C., while maintaining the temperature of the substrate between about 50° and 100° C. lower than the temperature of the source material.

In order to increase the mean-free path of the gas molecules and thus decrease the possibility of undesired or competitive reactions, the growth process is preferably carried out at a pressure of below about 1 atmosphere, and more preferably at a pressure of about 100 torr.

As another factor in increasing the mean-free path and decreasing the number of competitive reactions, the source material and the substrate are maintained at a distance of between about 10 and 30 millimeters from one another.

In this aspect, the method can likewise result in high quality gallium nitride crystals having thicknesses of between about 15 and 30 mils, diameter of at least two inches, and defect densities below $10^8$ cm$^{-2}$.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A growth process for producing bulk single crystalline gallium nitride with low defect density for semiconductor applications, the method comprising:
   introducing a gallium nitride source material and a seed crystal into a vapor transport crystal growth chamber;
   introducing an oxygen-containing gas, a hydrogen-containing gas, and a nitrogen containing gas into the vapor transport crystal growth chamber to encourage the source material to form volatile compounds containing gallium, oxygen and nitrogen;
   heating the source material to a temperature sufficient to encourage the volatile compositions to produce growth of gallium nitride on the seed crystal at a rate of at least about 10 microns per minute ($\mu$/min); and while
   heating the seed crystal to, and maintaining the seed crystal at, a temperature approaching, but less than the temperature of the source material to thereby preferentially encourage gallium nitride growth on the seed crystal.

2. A method according to claim 1 comprising:
   introducing water vapor as the oxygen-containing gas;
   introducing hydrogen as the hydrogen-containing gas; and
   introducing ammonia as the nitrogen-containing gas.

3. A method according to claim 1 wherein the step of introducing the oxygen-containing gas comprises introducing a gas selected from the group consisting of water vapor and carbon monoxide and mixtures thereof 4. A method according to claim 2 comprising the preliminary steps of:
   heating the seed crystal to a temperature higher than the temperature of the source material to prevent premature growth on the seed crystal prior to the steps of introducing the water vapor, hydrogen and ammonia into the growth chamber;
   thereafter introducing the water vapor, hydrogen and ammonia into the growth chamber; and
   thereafter inverting the temperature of the seed crystal and the source material to preferentially encourage gallium nitride growth on the seed crystal.

5. A method according to claim 1 comprising heating a gallium nitride seed crystal.

6. A method according to claim 1 comprising heating gallium nitride powder as the gallium nitride source material.

7. A method according to claim 6 comprising heating single crystalline gallium nitride as the gallium nitride source material.

8. A method according to claim 1 comprising heating polycrystalline gallium nitride as the gallium nitride source material.

9. A method according to claim 1 comprising maintaining the ambient pressure within the vapor transport crystal growth chamber below atmospheric pressure.

10. A method according to claim 9 comprising maintaining the ambient pressure within the vapor transport crystal growth chamber at about 100 torr.

11. A method according to claim 10 comprising maintaining a distance of between about 10 and 30 mm between the source material and the seed crystal in the growth chamber.

12. A method according to claim 1 comprising maintaining the source material at a temperature of between about 800° C. and 900° C. during crystal growth.

13. A method according to claim 1 comprising maintaining the seed crystal at a temperature that is between about 50° C. and 100° C. below the temperature of the source material during crystal growth.

14. A method according to claim 1 comprising introducing an oxygen-containing gas that will react to form a composition selected from the group consisting of $Ga_2O_3$, GaO, and $Ga_2O$ and mixtures thereof and in the growth chamber during the growth process.

15. A gallium nitride single crystal having a diameter of at least two inches, a thickness of 30 mils and a defect density of less than $10^8$ per square centimeter (cm$^{-2}$).

16. A growth process for producing bulk single crystal gallium nitride with low defect density for semiconductor applications, the method comprising:
   placing a gallium nitride source material and a gallium nitride seed crystal into a vapor transport crystal growth chamber;
   introducing water vapor, hydrogen and nitrogen into the growth chamber;
   heating the source material to a temperature sufficient to generate vapor phase gallium-oxygen compositions;
   heating the seed crystal to an elevated temperature that is marginally lower than the temperature of the source material to drive gallium nitride growth on the seed crystal by transporting the vapor phase gallium-oxygen compositions and the ammonia to form gallium nitride on the seed surface.

17. A growth process according to claim 16 comprising growth on the seed crystal at a rate of at least about 10 microns per minute ($\mu$/min).

18. A method according to claim 16 comprising separating the source material and the seed crystal by a distance sufficient to avoid instabilities at the crystal growth interface of the seed crystal.

19. A method according to claim 18 the source material and the seed crystal by a distance of between about 10 and 30 millimeters.

20. A method according to claim 16 comprising separating the source material and the seed crystal by a distance of between about 1 mm and 3 mm.

21. A method according to claim 16 comprising maintaining the ambient pressure within the vapor transport crystal growth chamber below atmospheric pressure.

22. A method according to claim 16 comprising maintaining the ambient pressure within the vapor transport crystal growth chamber at about 100 torr.

23. A method according to claim 16 comprising maintaining the source material at a temperature of between about 800° C. and 900° C. during crystal growth.

24. A method according to claim 23 comprising maintaining the seed crystal at a temperature that is between about 50° C. and 100° C. below the temperature of the source material during crystal growth.

25. A vapor transport growth process for bulk growth of high quality gallium nitride for semiconductor applications, the method comprising:

heating a gallium nitride source material, a substrate suitable for epitaxial growth of GaN thereon, ammonia, a transporting agent that will react with GaN to form gallium-containing compositions, and a carrier gas to a temperature sufficient for the transporting agent to form volatile Ga-containing compositions from the gallium nitride source material;

characterized by maintaining the temperature of the substrate sufficiently lower than the temperature of the source material to encourage the volatile gallium-containing compositions to preferentially form GaN on the substrate.

26. A growth process according to claim 25 comprising heating a gallium nitride source powder.

27. A growth process according to claim 25 comprising heating single crystal gallium nitride.

28. A growth process according to claim 25 comprising heating polycrystalline gallium nitride.

29. A growth process according to claim 25 comprising heating a sapphire substrate.

30. A growth process according to claim 25 comprising heating a silicon carbide substrate.

31. A growth process according to claim 25 comprising heating a gallium nitride substrate.

32. A growth process according to claim 25 comprising heating a seed crystal as the substrate.

33. A growth process according to claim 25 comprising heating a transporting agent that will react with gallium nitride to form compositions that contain gallium and oxygen.

34. A growth process according to claim 25 comprising heating a transporting agent selected from the group consisting of water vapor and carbon monoxide.

35. A growth process according to claim 25 comprising heating hydrogen as the carrier gas.

36. A growth process according to claim 25 comprising heating the source material to a temperature of between about 800° and 900° C.

37. A growth process according to claim 25 comprising maintaining the temperature of the substrate between about 50° and 100° C. lower than the temperature of the source material.

38. A growth process according to claim 25 comprising heating a transporting agent that will preclude the presence of atomic nitrogen.

39. A growth process according to claim 25 carried out a pressure of below one atmosphere.

40. A growth process according to claim 25 carried out a pressure of about 100 torr.

41. A growth process according to claim 25 further comprising the step of maintaining a distance of between about 10 and 30 mm between the source material and the substrate.

42. A method according to claim 1 wherein the gallium nitride growth occurs in an atmosphere that does not contain halogen compounds.

* * * * *